(12) United States Patent
Leussler et al.

(10) Patent No.: US 7,495,443 B2
(45) Date of Patent: Feb. 24, 2009

(54) RF COIL SYSTEM FOR SUPER HIGH FIELD (SHF) MRI

(75) Inventors: Christoph G. Leussler, Hamburg (DE); Christian Findeklee, Norderstedt (DE); Michael A. Morich, Mentor, OH (US); Zhiyong Zhai, Cleveland, OH (US); Gordon D. DeMeester, Wickliffe, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 370 days.

(21) Appl. No.: 10/595,862

(22) PCT Filed: Nov. 3, 2004

(86) PCT No.: PCT/IB2004/052291

§ 371 (c)(1),
(2), (4) Date: May 17, 2006

(87) PCT Pub. No.: WO2005/050239

PCT Pub. Date: Jun. 2, 2005

(65) Prior Publication Data

US 2008/0129292 A1    Jun. 5, 2008

Related U.S. Application Data

(60) Provisional application No. 60/520,979, filed on Nov. 18, 2003.

(51) Int. Cl.
*G01V 3/00* (2006.01)
(52) U.S. Cl. .................. 324/318; 324/309; 324/311; 324/322

(58) Field of Classification Search ......... 324/300–322; 600/407–435; 333/219–235
See application file for complete search history.

(56) References Cited

U.S. PATENT DOCUMENTS

| 4,680,548 | A | 7/1987 | Edelstein et al. |
| 4,746,866 | A | 5/1988 | Roschmann |
| 5,050,605 | A * | 9/1991 | Eydelman et al. ............ 600/422 |
| 5,053,711 | A | 10/1991 | Hayes et al. |
| 5,144,240 | A | 9/1992 | Mehdizadeh et al. |
| 6,043,658 | A | 3/2000 | Leussler |
| 6,396,271 | B1 | 5/2002 | Burl et al. |
| 6,462,636 | B1 | 10/2002 | Overweg et al. |
| 6,538,441 | B1 | 3/2003 | Watkins et al. |
| 6,888,153 | B2 * | 5/2005 | Hayes ..................... 250/515.1 |

(Continued)

OTHER PUBLICATIONS

Alecci, M., et al.; Theoretical and Experimental Evaluation of Detached Endcaps for 3T Birdcage Coils; 2003; MRM; 49:363-370.

(Continued)

*Primary Examiner*—Brij B. Shrivastav
*Assistant Examiner*—Tiffany A Fetzner (57) ABSTRACT

A radio frequency coil system (38) for magnetic resonance imaging includes a plurality of parallel spaced apart rungs (60) which each includes rung capacitors (68). An end cap (64) is disposed at a closed end (66) of the coil system (38). An RF shield (62) is connected to the end cap (64) and surrounds the rungs (60), extending in a direction substantially parallel to rungs (60). The RF coil system (38) may be used as birdcage, TEM, hybrid, combination birdcage and TEM, or other.

24 Claims, 7 Drawing Sheets

U.S. PATENT DOCUMENTS

| | | |
|---|---|---|
| 6,900,636 B2 | 5/2005 | Leussler |
| 6,982,553 B2 | 1/2006 | Holle |
| 7,084,629 B2 * | 8/2006 | Monski et al. .............. 324/318 |
| 7,180,291 B2 * | 2/2007 | Chmielewski et al. ...... 324/318 |
| 7,345,481 B2 * | 3/2008 | Leussler ..................... 324/318 |
| 2001/0035504 A1 * | 11/2001 | Hayes ..................... 250/515.1 |
| 2003/0122546 A1 | 7/2003 | Leussler |
| 2004/0155656 A1 | 8/2004 | Leussler |
| 2005/0099179 A1 * | 5/2005 | Monski et al. .............. 324/318 |
| 2006/0033497 A1 * | 2/2006 | Chmielewski et al. ...... 324/318 |
| 2007/0079253 A1 * | 4/2007 | Leussler ..................... 715/784 |
| 2008/0129292 A1 * | 6/2008 | Leussler et al. ............. 324/318 |
| 2008/0197848 A1 * | 8/2008 | Zhai et al. ................... 324/318 |

OTHER PUBLICATIONS

Hayes, C.E., et al.; An Efficient, Highly Homogeneous Radiofrequency Coil for Whole-Body NMR Imaging at 1.5 T; 1985; J. Mag. Reson.; 63:622-628.

* cited by examiner

RF COIL SYSTEM FOR SUPER HIGH FIELD (SHF) MRI

CROSS REFERENCE TO RELATED APPLICATIONS

This application claims the benefit of U.S. provisional application Ser. No. 60/520,979 filed Nov. 18, 2003, which is incorporated herein by reference.

DESCRIPTION

This application relates to the magnetic resonance arts. It finds particular application in super high field magnetic resonance imaging (MRI), and will be described with particular reference thereto. However, it also finds application in other magnetic resonance applications such as magnetic resonance spectroscopy, low field imaging, and the like.

Heretofore, magnetic resonance imaging scanners have included a main magnet, typically superconducting, which generates a spatially and temporally constant magnetic field $B_0$ through an examination region. A radio frequency (RF) coil, such as a whole-body coil, a head coil, and the like, and a transmitter have been tuned to the resonance frequency of the dipoles to be imaged in the $B_0$ field. The coil and transmitter have often been used to excite and manipulate these dipoles. Spatial information has been encoded by driving the gradient coils with currents to create magnetic field gradients in addition to the $B_0$ field across the examination region in various directions. Magnetic resonance signals have been acquired by the same or separate receive-only RF coil, demodulated, filtered and sampled by an RF receiver and finally reconstructed into an image on some dedicated or general-purpose hardware.

In MRI, RF coils are used to generate $B_1$ magnetic fields for exciting the nuclear spins and detecting signals from them. Two types of RF coils, birdcage and transverse electromagnetic (TEM) coils, are widely used for imaging. The birdcage coil has multiple conductor rungs which are arranged around the examination region extending parallel to the main field direction. The parallel conductor rungs are connected to each other via an end cap or ring at one end of the coil and a circular loop conductor at the other end. Current flows back and forth through the rungs, the end cap, and the loop. The resonance behavior of the birdcage is determined by capacitor elements arranged within the parallel conductors and the circular loop conductor. Birdcage coils exhibit a substantially uniform magnetic field distribution in their interior at frequencies at or under 128 MHz, which correspond to proton imaging in a main $B_0$ magnetic field of 3T. However, for super high field applications ($B_0$>3 T), the application of birdcage coils is limited with respect to radiation losses due to propagation effects inside the bore of the MR system and strong loading effects of the tissue. Typically, the losses become unacceptable when half the wavelength at resonance is less than the bore diameter.

The problem of radiation losses can be overcome by reducing the diameter of the RF bore. The cut-off frequency of a bore with traditional 0.7 m diameter is 259 MHz. Hence, an open birdcage cannot be used for whole body MRI at 7T, where the proton resonance is 298 MHz and the half wavelength is even smaller. Reducing the diameter of the bore increases the cut off frequency, but the strong coupling to the tissue due to RF eddy currents ($\sim\omega^2$) is still a fundamental problem. The induced impedance in the conductors caused by the asymmetric subject loading can generate strong $B_1$ inhomogeneity. Maintaining patient loading symmetry becomes more difficult as the RF coil becomes smaller and approaches the subject more closely.

Similar to the birdcage coils, TEM coils include parallel conductors, which are arranged around the examination region. The TEM coil is typically open on both ends, lacking both the end cap and the circular loop conductor. The TEM coil typically includes an outer RF current return path. TEM coils tend to provide improved radio, frequency, performance compared with the birdcage coils for higher frequency applications ($B_0$>3T) due to lower radiation losses. Yet, the TEM coils, have some disadvantages. For example, the TEM coils are leaky from the standpoint of electromagnetic fields, generating stray RF fields. The birdcage coil has better; $B_1$ homogeneity in the axial z-direction.

There is a need for the super high frequency (SHF) coil system which provides good RF properties in high frequencies applications. The present invention provides an improved imaging apparatus and an improved method, which overcome the above-referenced problems and others.

In accordance with one aspect of the present invention, a radio frequency coil system for magnetic resonance imaging is disclosed. The coil system includes a plurality of parallel spaced apart rungs which each includes rung capacitors; an end cap disposed at a closed end of the coil system; and an RF shield which is connected to the end cap and surrounds the rungs extending in a direction substantially parallel to rungs.

In accordance with another aspect of the present invention, a method of using the coil system is disclosed. The coil system includes a plurality of parallel spaced apart rungs which each includes rung capacitors; an end cap disposed at a closed end of the coil system; and an RF shield which is connected to the end cap and surrounds the rungs extending in a direction substantially parallel to rungs.

One advantage of the present invention resides in providing a uniform field when using a birdcage-like structure at super high frequencies.

Another advantage resides in its ability to function as a bandpass transmit/receive coil array.

Another advantage resides in its scalability.

Another advantage is that it has features of TEM and birdcage coils.

Another advantage resides in its ability to be configured to provide a double resonant coil system.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
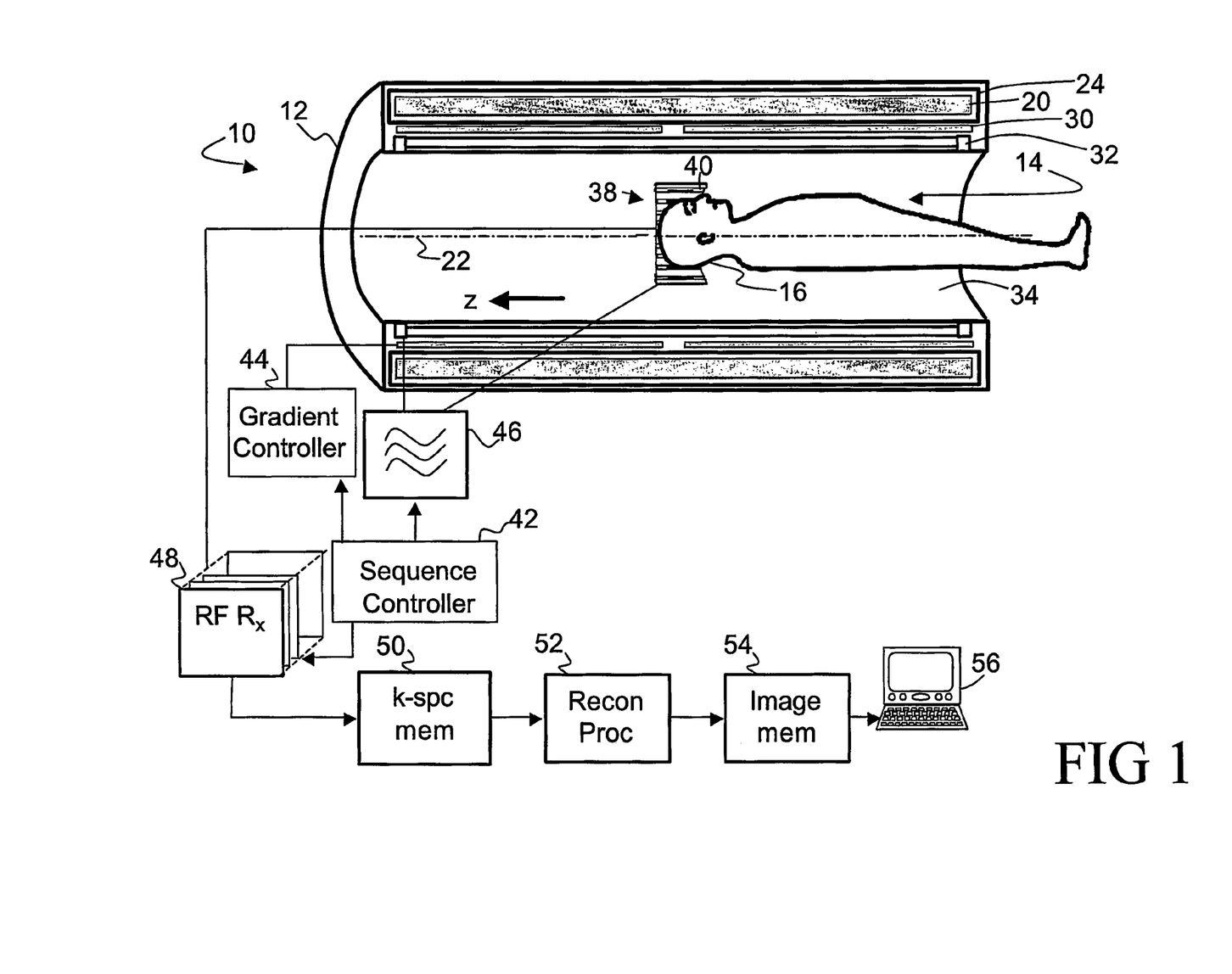
FIG. 1 is a diagrammatic illustration of a magnetic resonance imaging system in accordance with the present invention.

With reference to FIG. 1, a magnetic resonance imaging scanner 10 includes a housing 12 defining a generally cylindrical scanner bore 14 inside of which an associated imaging subject 16 is disposed. A main magnet or main magnetic field coils 20 are disposed inside the housing 12. The main magnetic field coils 20 are arranged in a generally solenoidal configuration in the preferred high field embodiment to produce a main $B_0$ magnetic field directed along a z-direction lying parallel to a central axis 22 of the scanner bore 14. The main magnetic field coils 20 are typically superconducting coils disposed inside in cryoshrouding 24, although resistive main magnets can also be used.

The housing 12 also houses or supports magnetic field gradient coils 30 for selectively producing magnetic field gradients along the z-direction, along in-plane directions transverse to the z-direction (such as along Cartesian x- and y-directions), or along other selected directions. The housing 12 also houses or supports a high frequency whole body RF coil 32 for selectively exciting and/or detecting magnetic resonances. The housing 12 typically includes a cosmetic inner liner 34 defining the scanner bore 14. In addition to the whole body radio frequency coil 32, a high frequency head RF coil system 38, which includes one or more RF coils 40, is disposed. As described in detail below, the high frequency whole body and head RF coils have birdcage, TEM, hybrid, combination birdcage and TEM, or other embodiments. The coil system 38 is preferably circularly cylindrical, but, of course, might have other geometries, such as an elliptic cross-section, semi-circular cross-section, semi-elliptical cross-section, and the like.

The main magnetic field coils 20 produce a main magnetic field $B_0$ in a z-direction which is preferably greater than 3.0T, such as 7.0T. A sequence controller 42 operates gradient controller 44 to selectively energize the magnetic field gradient coils 30 and operates a radio frequency transmitter 46 coupled to one or more of the radio frequency coils 32, 40 to selectively energize the radio frequency coil or coils 32, 40. By selectively operating the magnetic field gradient coils 30 and the one or more radio frequency coils 32, 40, magnetic resonance is generated and spatially encoded in at least a portion of a selected region of interest of the imaging subject 16. A radio frequency receiver 48, or in a SENSE mode a receiver for each SENSE channel, is coupled to one or more of the radio frequency coils 32, 40 to receive encoded magnetic resonance k-space samples that are stored in a k-space memory 50.

A reconstruction processor 52 applies a suitable reconstruction algorithm such as an inverse Fourier transform reconstruction algorithm, a SENSE algorithm, or the like to reconstruct the k-space samples into a reconstructed volume image representation including at least a portion of the region of interest of the imaging subject. The reconstructed image representation is stored electronically in an image memory 54, displayed on a user interface 56, stored in non-volatile memory, transmitted over a local intranet or the Internet, or otherwise viewed, stored, manipulated, or so forth. The user interface 56 can also enable a radiologist, technician, or other operator of the magnetic resonance imaging scanner 10 to communicate with the sequence controller 42 to select, modify, and execute magnetic resonance imaging sequences.

Figure 2:
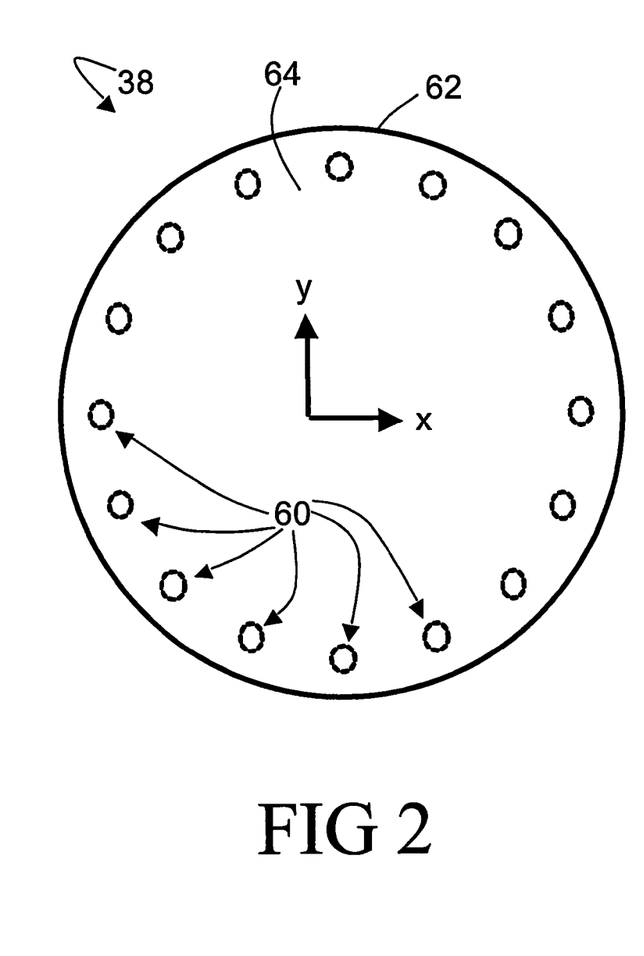
FIG. 2 is a diagrammatic illustration of an end section of the coil system of FIG. 1.
Figure 3:
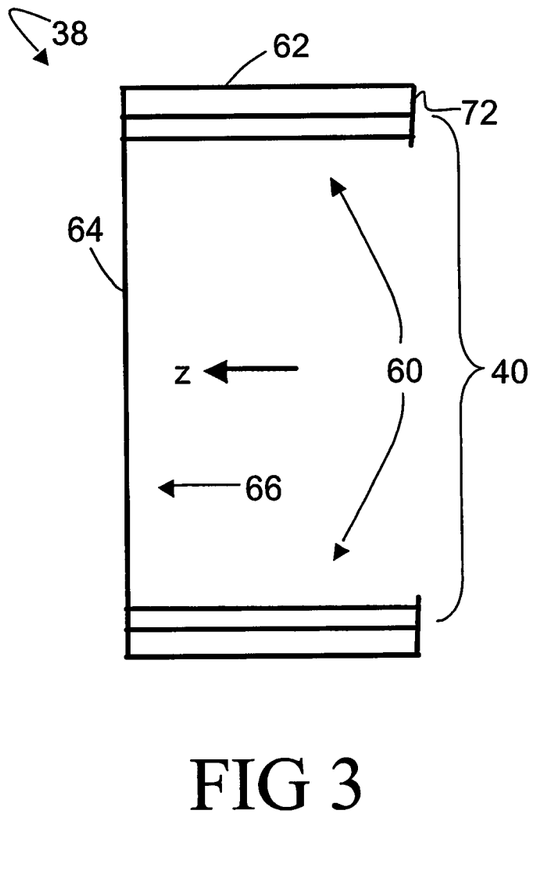
FIG. 3 is a diagrammatic illustration of a side view of the coil system of FIG. 1.

With reference to FIGS. 2 and 3, the RF coil 40 includes a plurality of spaced apart parallel conductors or rungs or strips 60 which extend longitudinally in the z-direction parallel to the main magnetic field $B_0$. The rungs 60 are made of printed circuit board, copper foil, conductive rod, and the like, and, in one embodiment, include sections varying in size and width. The rungs 60 are shown on-end in phantom in FIG. 2. Local RF magnetic field detectors, such as loop sensors (not shown) are connected with the coil to measure coil currents. A generally cylindrical radio frequency screen or shield 62 surrounds the strips 60. To minimize eddy currents, the RF screen 62 is preferably slotted foil, mesh, or the like. A conductive end cap 64 is disposed at an end section 66 of the coil system 38. In FIG. 2, Cartesian x-y-z coordinates are indicated corresponding to the spatial orientation of the coil system 38 in the cylindrical scanner bore 14 shown in FIG. 1. However, it will be appreciated that the coil system 38 may be used in other orientations.

Figure 4:
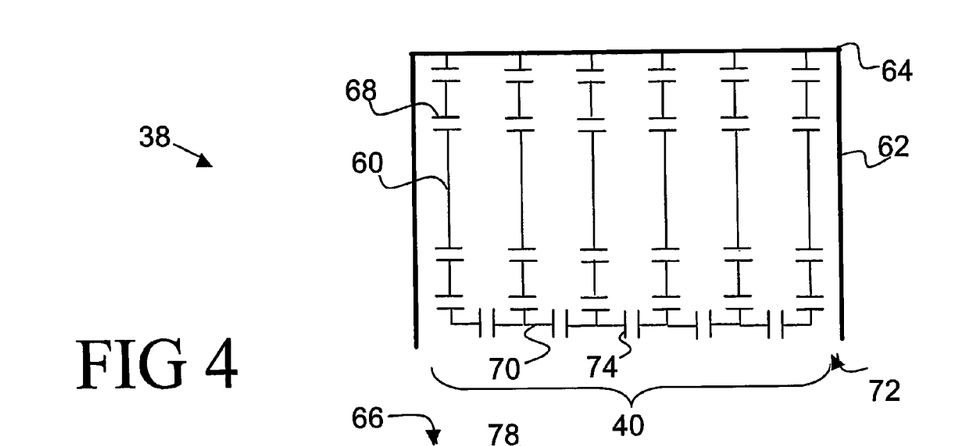
FIG. 4 is a diagrammatic illustration of electrical connections of a shielded birdcage coil embodiment of the coil system of FIG. 1.

With reference to FIG. 4, in a birdcage embodiment of the coil 40, each individual strip 60 includes a plurality of strip resonance frequency tuning capacitors 68 and is connected to the end cap 64, which defines return paths for the rungs. The capacitors are preferably lumped and/or distributed PCB designs along the strips 60 to prevent propagation effects. The end cap 64 is directly connected to the RF screen 62 which allows the birdcage coil 40 to work at super high frequency. Each strip 60 is connected to a copper ring 70, which is disposed at a top section 72 of the coil system 38, opposing the coil system end section 66. Each of two neighboring strips 60 are coupled; by end tuning capacitors 74 disposed along the ring 70 to define current paths. The coil of FIG. 4, which includes both the capacitors in the strips and in the ring, generally behaves as a band-pass coil. Depending on whether the strips 60 or segments of the ring 70 behave inductively, the bandpass coil 40 might behave as a high-pass or a low-pass type coil. The low-pass type is formed when the strip capacitors 68 of the strips 60 have much higher values than the end capacitors 74, thus the segments of the end ring 70 exhibit an inductive behavior; whereas, the strips 60 exhibit the capacitive behavior. The high-pass type is formed when the capacitors 68 of the strips 60 have much lower values than the end capacitors 74, thus the segments of the end ring 70 exhibit the capacitive behavior; whereas, the strips 60 exhibit the inductive behavior. For the bandpass type, the capacitors 68, 74 are proportioned so that neither a high-pass, nor a low-pass behavior occurs.

Figure 5:
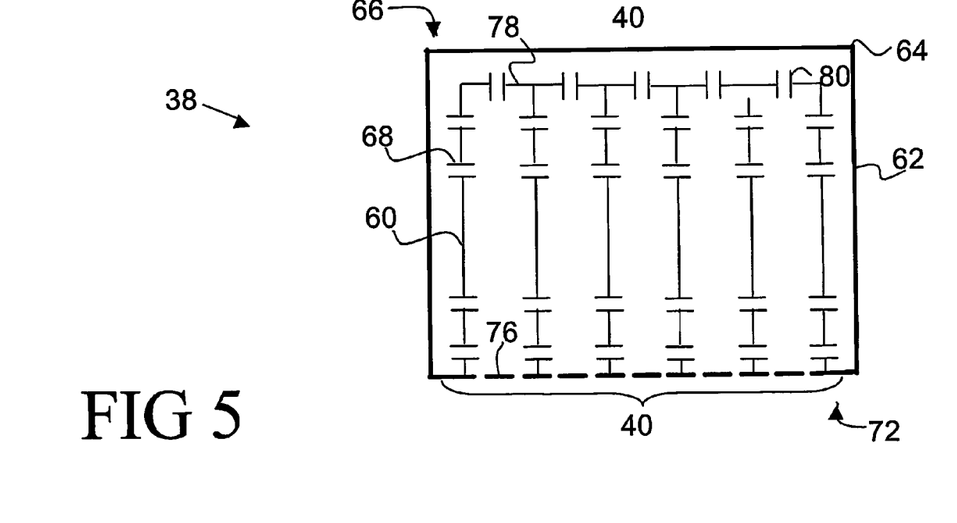
FIG. 5 is a diagrammatic illustration of electrical connections of a shielded birdcage coil embodiment of the coil system of FIG. 1 with an open-end ring at top section.

With reference to FIG. 5, the RF coil 40 is similar to the coil of FIG. 4. The top section 72 is open. The individual strips 60 are directly connected to the RF screen 62 (shown as a dotted line 76) at the top section 72. Each strip 60 is connected to a copper ring 78, which is disposed at the end section 66 of the coil system 38, opposing the coil system top section 72. Each of two neighboring strips 60 are coupled by closed end tuning capacitors 80 disposed along the ring 78 to define current paths. Such configuration reduces RF components of the $B_1$ field component that is oriented in the z-direction, near the top section 72, and thus reduces SAR in this region of the coil.

Figure 6:
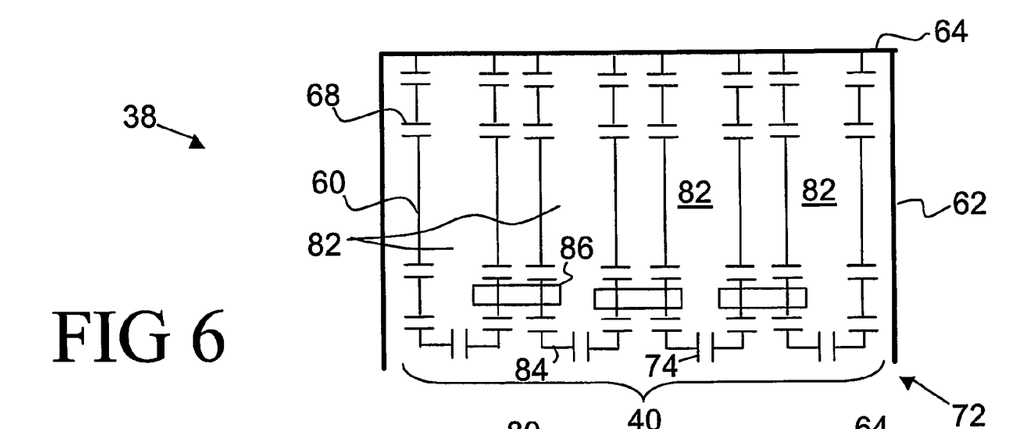
FIG. 6 is a diagrammatic illustration of electrical connections of a resonator embodiment of the coil system of FIG. 1 including separate meshes.
Figure 7:
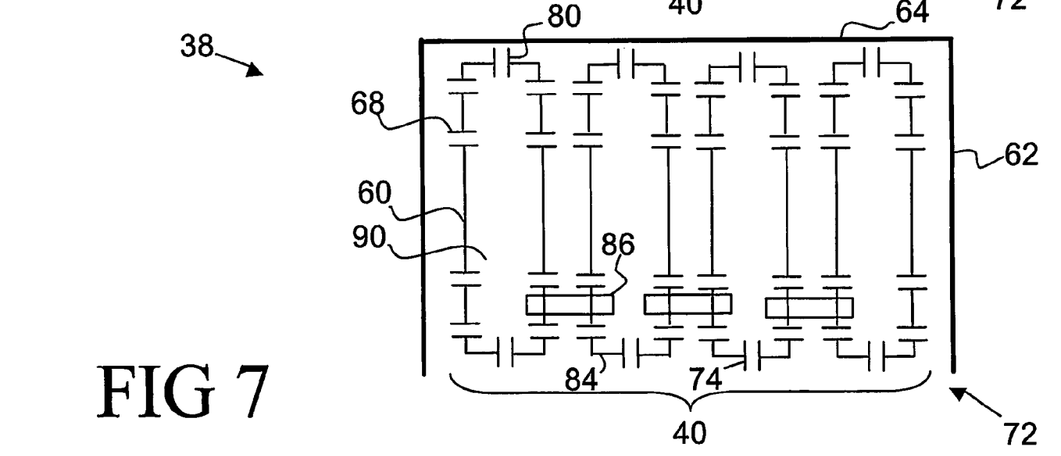
FIG. 7 is a diagrammatic illustration of electrical connections of a resonator embodiment of the coil system of FIG. 1 including individual meshes with coupling and decoupling networks.
Figure 8:
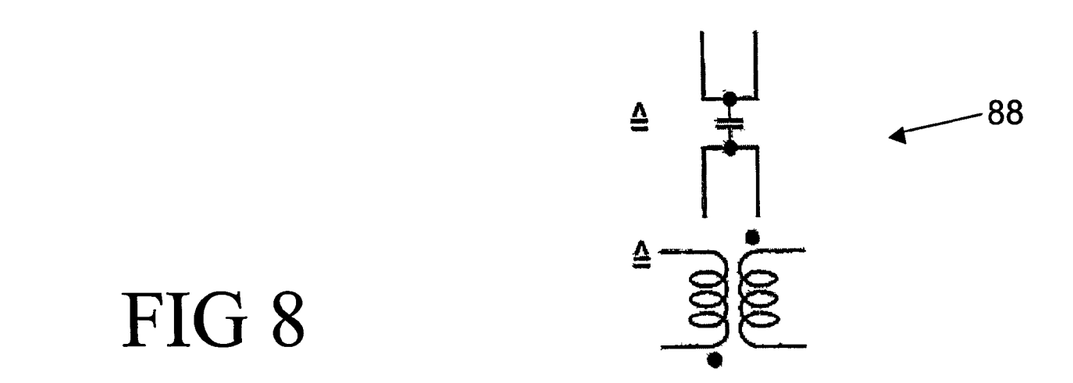
FIG. 8 is a diagrammatic illustration of impedance transformers to control coupling/decoupling with the coil system of FIG. 1.

With reference to FIGS. 6 and 7, the individual strips 60 are arranged into individual meshes 82 with each mesh having different phase reception characteristics. Each mesh 82 includes two strips 60 coupled through the end capacitors 74 connected in between the each two strips 60 at the open end section 72. The RF currents of the meshes 82 flow through individual end ring segments 84, which are not connected directly to the RF screen 62. The meshes 82 are coupled with the receiver 48 and, optionally, the transmitter 46, by couplings 86, which are preferably capacitive or inductive impedance circuits, to provide individual send/receive channels. In addition, by the use of the impedance circuits between individual meshes, the mutual induction can be increased to provide higher mode separation and better robustness against asymmetric and heavy patient loading. In one embodiment, the couplings 86 include impedance transformers 88, shown in FIG. 8. The impedance transformers 88 control the mutual magnetic coupling between the individual meshes 82. The couplings 86 can be adjusted such that the coil 40 of FIGS. 6 and 7 can work as a volume coil generating a circularly polarized $B_1$ RF field, like a birdcage coil, or as a transmit/receive array, e.g., a SENSE coil. Such a transmit/receive array can generate a circularly polarized RF field and also can cover all mode patterns and generate individual RF field homogeneity required for RF shimming. Active switching components (not shown) are preferably used to switch the capacitances (68, 74) to switch from the volume mode coil to the transmit/receive mode coil. Switching takes place without a need to exchange the coils.

With continuing reference to FIG. 7, the individual meshes 82 are arranged into individual complete loops 90, which are not directly coupled to the end cap or RF shield. In addition to each two strips 60 being coupled through the open end capacitors 74, the each two strips are also coupled through the closed end capacitors 80. In coil configuration of FIG. 7, the RF screen 62 is not directly connected to the coil 40.

Figure 9:
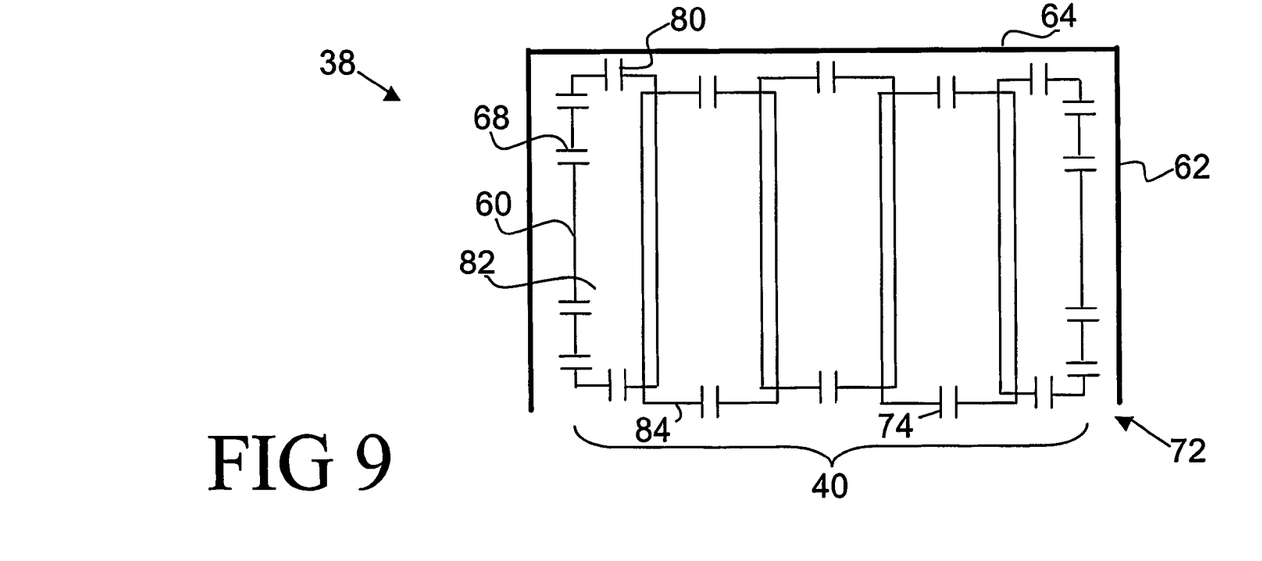
FIG. 9 is a diagrammatic illustration of electrical connections of a resonator embodiment of the coil system of FIG. 1 including individual meshes decoupled by overlap.

With reference to FIG. 9, another configuration of the decoupled meshes is shown, in which the individual meshes 82 are overlapped with each other, preferably to a degree that minimizes mutual inductive coupling.

Figure 10:
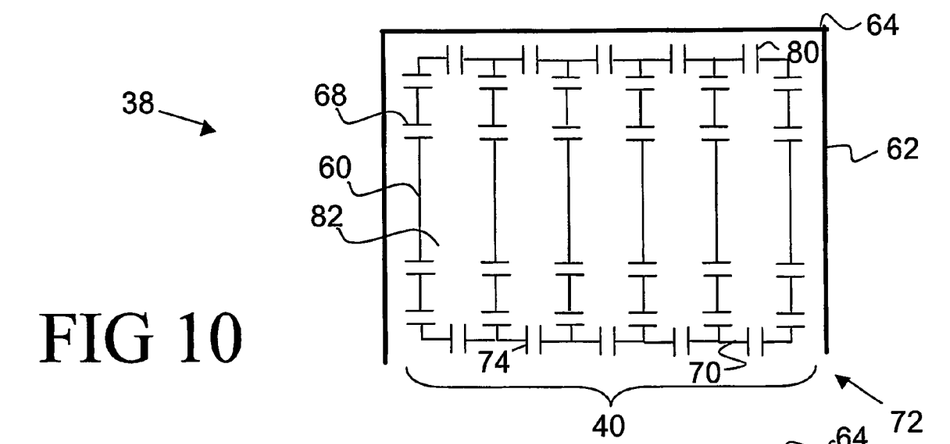
FIG. 10 is a diagrammatic illustration of electrical connections of a bandpass birdcage coil embodiment of the coil system of FIG. 1.

With reference to FIG. 10, the illustrated coil 40 is a bandpass birdcage coil disposed inside an RF screen 62. Adjacent rungs 60 are coupled through the open end capacitors 74, disposed at the ring 70, and through the closed end capacitors 80. The ratio of capacitance of the capacitors 74, 68 is selected to decouple the current loops. The coil 40 can alternately be used as a transmit/receive array, in which each individual coil segment is connected to an individual transmit/receive channel, which each, preferably, has fully controllable individual phase and amplitude. The coil system of FIG. 10 provides geometric openness and excellent RF properties for high frequency applications.

Figure 11:
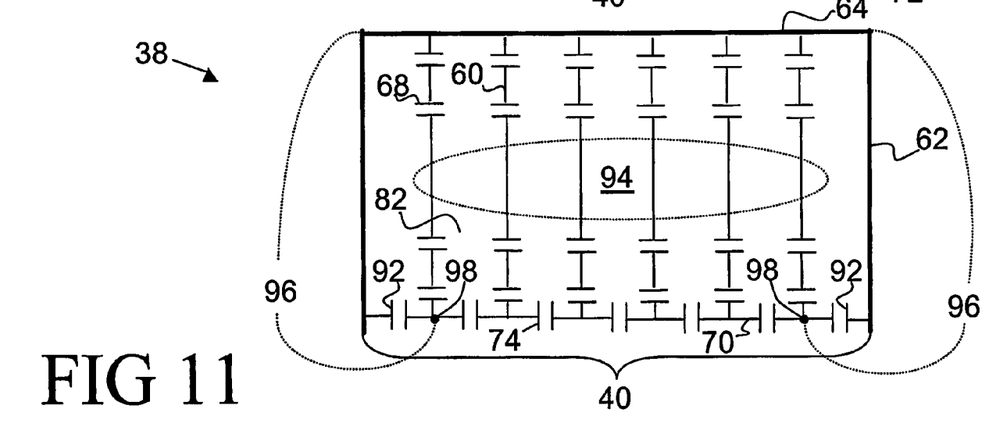
FIG. 11 is a diagrammatic illustration of electrical connections of a double resonant RF coil resonator embodiment of the coil system of FIG. 1.

With reference to FIG. 11, the coil 40 is a double resonant RF coil resonator whose capacitances are selected such that it functions as a birdcage bandpass coil at the resonant frequency of one dipole and a TEM coil at the resonance frequency of another dipole. Each rung 68 is connected to the end cap 64 and also to the end ring 70 at the open end 72. Each pair of rungs 60 is coupled by the open end capacitors 74, which are disposed along the end ring 70. Capacitors 92 are connected between the end ring 70 at a connection node 98 and the RF screen 62, creating a tunable current path through the RF screen 62. The current path through the capacitor 92 is tuned to the TEM resonance mode at a higher resonance frequency; and to the rotating $B_1$ field bandpass mode at a lower frequency. For example, the TEM mode can be tuned to the proton ($^1H$) resonance frequency and the bandpass mode to the phosphorous ($^{31}P$) resonance frequency.

Figure 12:
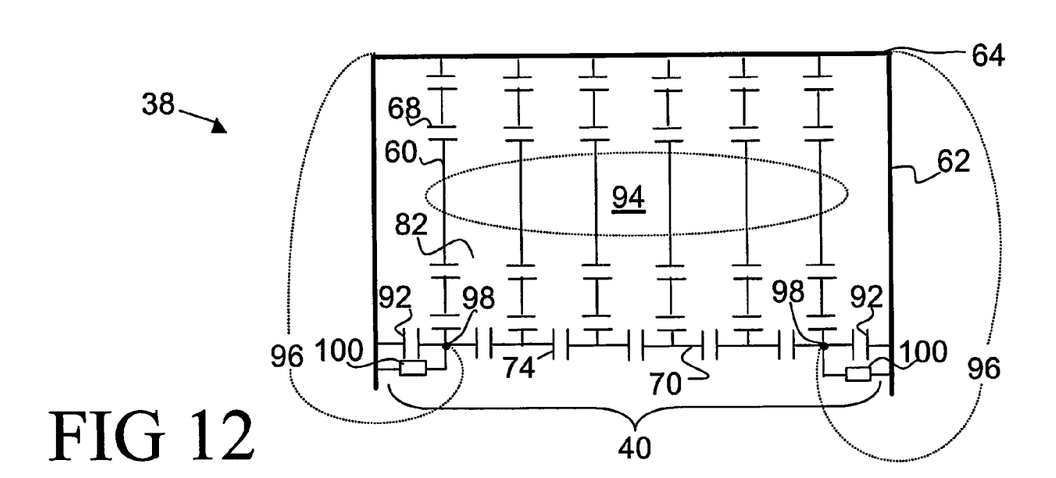
FIG. 12 is a diagrammatic illustration of electrical connections of a triple resonant RF coil resonator embodiment of the coil system of FIG. 1.

In one embodiment, shown in FIG. 12, a triple resonant RF coil resonator is configured with lumped inductors 100 connected in parallel to the capacitors 92. The inductors 100 generate a third resonance mode.

Figure 13:
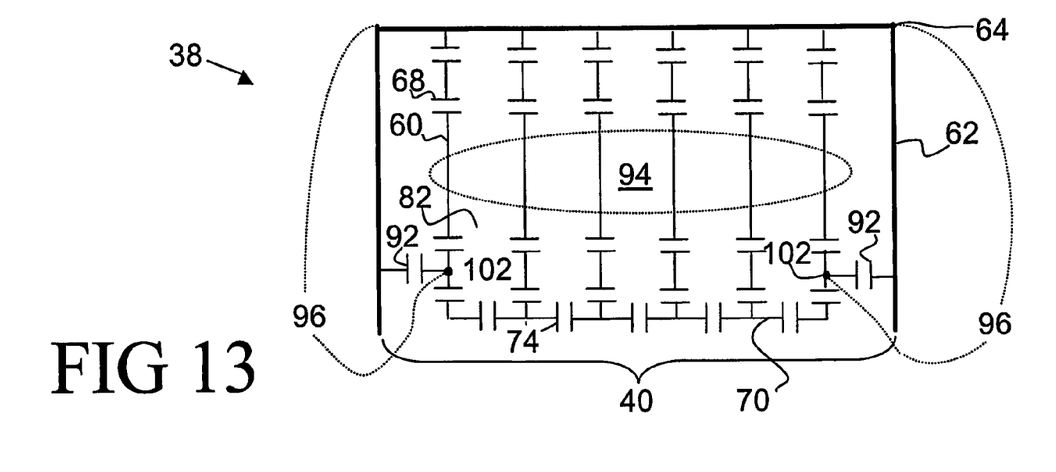
FIG. 13 is a diagrammatic illustration of electrical connections of a double resonant RF coil-resonator embodiment of the coil system of FIG. 1.

In the double resonant RF coil resonator shown in FIG. 13, the capacitors 92 are connected in between at least one point 102 along the rungs 60 and the RF screen 62 to provide a current path through the RF screen 62 and to tune the second resonance mode.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A radio frequency coil system configured for magnetic resonance imaging, the coil system comprising:
   a plurality of parallel spaced apart rungs which each include rung capacitors;
   an end cap disposed at a closed end of the radio frequency coil system; and
   an RF shield which is connected to the end cap and surrounds the rungs, the RF shield extending in a direction substantially parallel to rungs.

2. The coil system as set forth in claim 1, wherein the RF shield is partially or wholly constructed of electrically conductive mesh or other conductive material with properties of at least partial optical transparency in a wavelength range of human vision.

3. The coil system as set forth in claim 1, further including:
   an end ring disposed at an closed end of the coil system and being coupled to the rungs, the end ring having capacitors between neighboring rungs.

4. The coil system as set forth in claim 3, wherein the rungs are directly connected to the RF shield at an open end.

5. The coil system as set forth in claim 1, further including:
   an end ring disposed at an open end of the coil system and being coupled to the rungs, the end ring having capacitors between neighboring rungs.

6. The coil system as set forth in claim 5, wherein each pair of neighboring rungs is further coupled through closed end capacitors to define individual independent current loops or meshes.

7. The coil system as set forth in claim 6, wherein the capacitors are selected to decouple the current loops or meshes to define a transmit/receive coil array forming a plurality of individual transmit/receive channels, such that each loop has selected phase and amplitude characteristics.

8. The coil system as set forth in claim 5, wherein at least one of the end ring and the rungs are capacitively coupled to the RF shield adjacent the open end via capacitors to define a current path through the RF shield.

9. The coil system as set forth in claim 8, wherein the coil system is a transmit/receive coil and a volume coil.

10. The coil system as set forth in claim 9, further including:
inductors connected between at least one of the end ring and the rungs to define a third resonance mode.

11. The coil system as set forth in claim 5, wherein the rung and end ring capacitors are selected to tune the coil system to a resonance frequency in one of:
a low-pass mode,
a high-pass mode, and
a bandpass mode.

12. The coil system as set forth in claim 1, wherein the rungs are directly connected to the end cap.

13. The coil system as set forth in claim 1, wherein the rungs are capacitively coupled to the RF shield.

14. The coil system as set forth in claim 1, wherein pairs of the rungs are coupled by open end capacitors to define individual meshes and further including:
couplings coupled to adjacent meshes, the couplings including one of:
capacitive decouplings,
inductive decouplings,
impedance transformers, and
overlapping portions of the individual meshes.

15. The coil system as set forth in claim 14, wherein the coil system is tuned by the rung capacitors, the open end capacitors, and the couplings to one of a volume mode and a SENSE mode.

16. The coil system as set forth in claim 15, wherein the couplings include switching components for selectively switching between the volume mode and the SENSE mode.

17. The coil system as set forth in claim 16, wherein each rung is directly connected to the end cap and each mesh includes the end ring capacitor disposed at an open end of the coil system.

18. The coil system as set forth in claim 17, wherein each pair of the rungs of each mesh is further coupled by a closed end capacitor to define individual independent current loops.

19. A method of using the coil system of claim 1 comprising:
coupling an end ring to an open end of the coil system, the end ring having open end capacitors between neighboring rungs to define a bandpass mode.

20. The method as set forth in claim 19, further including:
coupling each pair of neighboring rungs through closed end capacitors to define individual independent current loops;
proportioning the rung and open end capacitors to decouple the current loops to define a transmit/receive coil array.

21. The method as set forth in claim 19, further including:
capacitively coupling at least one of the end ring and the rungs to the RF screen adjacent the open end via capacitors to define a current path through the RF screen;
tuning the capacitors to a high resonance frequency to define a dual resonance mode, wherein the coil system is a transmit/receive coil and a volume coil.

22. The method as set forth in claim 19, further including:
coupling pairs of the rungs by open end capacitors to define individual meshes;
coupling adjacent meshes by one of:
capacitive couplings,
inductive couplings,
impedance transformers, and
overlapping portions of the individual meshes.

23. The method as set forth in claim 19, further including:
tuning the coil system by the rung capacitors, the open end capacitors, and the couplings to one of a volume mode and a SENSE mode.

24. A magnetic resonance imaging scanner including:
a magnet producing a main magnetic field;
a plurality of magnetic field gradient coils arranged to produce magnetic field gradients to the main magnetic field; and
the radio frequency coil system as set forth in claim 1, the rungs extending in a direction substantially parallel to the main magnetic field.

* * * * *